(12) United States Patent
Pisipaty

(10) Patent No.: US 6,628,112 B2
(45) Date of Patent: Sep. 30, 2003

(54) SYSTEM AND METHOD FOR DETECTING PHASE OFFSET IN A PHASE-LOCKED LOOP

(75) Inventor: Anuradha Pisipaty, San Jose, CA (US)

(73) Assignee: Conexant Systems, Inc., Newport Beach, CA (US)

(*) Notice: Subject to any disclaimer, the term of this patent is extended or adjusted under 35 U.S.C. 154(b) by 0 days.

(21) Appl. No.: 09/896,871

(22) Filed: Jun. 28, 2001

(65) Prior Publication Data

US 2003/0001557 A1 Jan. 2, 2003

(51) Int. Cl.[7] .............................................. G01R 23/12
(52) U.S. Cl. ....................................................... 324/76.53
(58) Field of Search ........................... 324/76.53, 76.52, 324/76.54, 76.77; 375/215, 294, 327; 331/25

(56) References Cited

U.S. PATENT DOCUMENTS

| | | | |
|---|---|---|---|
| 4,535,459 A | | 8/1985 | Hogge, Jr. ................... 375/324 |
| 5,027,085 A | | 6/1991 | DeVito ........................ 331/1 A |
| 5,907,863 A | | 5/1999 | Bolyn ........................ 711/167 |
| 5,953,386 A | * | 9/1999 | Anderson ................... 375/376 |
| 6,034,554 A | * | 3/2000 | Francis et al. ................ 327/7 |
| 6,373,235 B1 | * | 4/2002 | Barker ..................... 324/76.53 |
| 6,392,457 B1 | * | 5/2002 | Ransijn ..................... 327/156 |

OTHER PUBLICATIONS

Hogge, C.R., "A Self Correcting Clock Recovery Circuit," *IEEE Journal of Lightwave Technology*, vol. LT–3, pp. 1312–1314, Dec. 1985.

* cited by examiner

*Primary Examiner*—Michael Nghiem
(74) *Attorney, Agent, or Firm*—SEED IP Law Group PLLC

(57) ABSTRACT

In a phase detection circuit, an incoming data signal is fed to one D flip-flop which is enabled off of a rising or positive edge of the clock which in turn feeds its output to a second D flip-flop enabled off of the same clock edge. The same incoming data is also fed to a third D flip-flop which is enabled off of a falling or negative clock edge of the same clock signal. The output of which is in turn fed into a fourth D flip-flop which is enabled off of the same negative edge. The incoming data is also fed to a first XOR gate, along with the output of the first D flip-flop to generate the error phase detection signal. The outputs of the second and fourth D flip-flops are fed into a second XOR gate to generate the reference phase detection signal.

20 Claims, 5 Drawing Sheets

SYSTEM AND METHOD FOR DETECTING PHASE OFFSET IN A PHASE-LOCKED LOOP

FIELD OF THE INVENTION

This invention relates to synchronous data detection, and more specifically, relates to a phase detection circuit that operates in multiple capacities of synchronous data detection.

BACKGROUND OF THE INVENTION

In systems for synchronous transmission of digital data, an information signal is sent from a transmitting unit to a receiving unit. This transmission may take place over serial or parallel data channels. In either case the data is sent in synchronism with a clock signal. In order to save bandwidth, the clock signal is normally not transmitted with the data. Hence, the receiving unit receives the signal at the same clock rate at which it is transmitted.

Two typical methods for transmitting digital data are baseband and carrier-based transmission. In baseband transmission, a signal is sent directly over a communications link. In carrier-based transmission, the signal is first modulated onto a carrier signal. The modulated carrier signal is then sent to the receiving unit. Common modulation techniques include amplitude modulation (AM), frequency modulation (FM) and phase modulation (PM). When a modulated signal reaches the receiving unit, it is demodulated from the carrier signal to its original form by demodulation circuitry.

The receiving unit then extracts the clock from the baseband or demodulated carrier-based signal in order to generate a reference by which the data can be interpreted. The method for extracting the clock depends on the type of data format used in the binary signal. Some examples of data formats are non-return to zero (NRZ), return to zero (RZ), biphase and delay-modulation.

Each format has associated advantages and disadvantages. The RZ format, for instance, contains a spectral line at the clock frequency, which makes clock recovery easy. The NRZ format, conversely, does not necessarily contain a spectral line at the clock frequency and requires additional circuitry for extraction. The NRZ format is advantageous in another way, however, in that it uses half the bandwidth as does the RZ format, which increases the amount of data that can be sent. Hence, data formats are chosen primarily by the needs and allowances of the particular application.

When using a format such as the NRZ format, the clock must be recovered from the signal. This operation is typically performed by a phase-locked loop (PLL). As depicted in FIG. 1, a PLL 100 typically comprises phase offset detection circuitry 102, loop filter circuitry 104 and a voltage controlled oscillator (VCO). PLL 100 modulates VCO 106 until it is in phase with the incoming data. The signal generated by VCO 106 is then used as the reference clock to interpret the data signal.

In order to do this, phase detector circuit 102 detects the phase difference between the incoming data signal and the output of VCO 106 and generates phase detection signals 108. Phase detection signals 108 have a difference in average value that corresponds to the difference in phase between the incoming data signal and the VCO 106 output. Loop filter 104 converts the difference in average value into an analog voltage signal and filters the signal to remove extraneous noise. An example analog voltage signal 200 is shown in FIG. 2A. Signal 200 is fed to VCO 106, which slows down or speeds up in response, bringing the output of VCO 106 into phase with the incoming data. Once aligned with the incoming data, the output of VCO 106 is used as the clock signal for interpreting incoming data A conventional PLL circuit 300 containing a phase detector 330 is depicted in FIG. 3. A description and operating theory behind circuit 300 can be found in "A Self Correcting Clock Recovery Circuit," IEEE Journal of Lightwave Technology, vol. LT-3, pp. 1312–1314, Dec. 1985. Circuit 300 provides a basic means for aligning data and clock phase and comprises phase detector 330, loop filter 328 and VCO 314.

Phase detector 330 comprises two D flip flops 302 and 304 connected in series, and two XOR gates 306 and 308 tied to the input and output of, respectively, flip-flops 302 and 304. Incoming data is supplied to input node 310 of flip-flop 302 and the input of XOR gate 306. VCO 314 provides a clock signal to flip-flop 302 at its clock input node 316. D flip-flop 302 enables its output 312 on every rising edge of this clock signal. Output 312 is connected directly to the input of XOR gates 306 and 308, as well as to the input to D flip-flop 304. D flip-flop 304 enables its output 318 on the rising edge of the inverted clock signal provided by VCO 314. Hence, flip-flops 302 and 304 operate one-half clock cycle apart. The output 318 of D flip-flop 304 is connected to the second input of XOR gate 308.

Phase detector 330 produces two phase detection signals by which the phase offset is measured. The phase detection signals, commonly referred to as reference signals, are square pulse signals generated for each transition of the incoming data and having a fixed width equal to half the clock period. The first phase detection signal is output 324 of XOR gate 308. It is a square pulse signal commonly referred to as a reference signal that is generated for every transition of the incoming data and has a fixed width equal to half the clock period.

The second phase detection signal is provided by the output 322 of XOR gate 306. The second phase detection signal is a variable width, square pulse signal with a pulse generated for every transition of the incoming data. The width of this square pulse is dependent upon the position of the rising clock edge in relation to each incoming data transition. This signal is commonly referred to as an error signal. When the rising edge of the clock is in phase with the incoming data, the width of the data pulses produced in the error and reference signals are the same. There is no difference in average value between the signals and correspondingly, the frequency of VCO 314 is not modulated.

When the rising edge of the clock lags behind the incoming data transition, the data pulse in the error signal decreases in width and has an average value less than the fixed width pulse of the reference signal. As a result, a negative error voltage is produced by loop filter 328 and fed to VCO 314. When the rising edge of the clock arrives before the incoming data transition, the data pulse in the error signal increases in width and has an average value more than the fixed width pulse of the reference signal. As a result, a positive error voltage is produced by loop filter 328 and fed to VCO 314.

As data frequencies rise, the delay, hold and setup times associated with circuit 300 become smaller in order to accommodate shorter data pulse widths and to guard against timing violations. However, phase detector 300 will begin to experience difficulty at these higher frequencies. Properly balancing propagation delays and drive strengths of the D flip-flops 302 and 304 becomes very difficult. In order for the flip-flops to be powerful enough to drive their outputs to satisfy shorter hold and setup times, they must be larger in terms of circuit geometry. But as their size increases, the distance the distance that data signal 310 must travel also increases and creates longer propagation delays. The propagation delays will begin to violate the hold and setup times of the various logic gates and the circuit will fail to recognize data pulses. These pulses are generally referred to as "missed pulses." Missed pulses can translate into a "dead zone" in the analog voltage signal at the phase detector output, resulting in phase jitter. An analog voltage signal 202 with a dead zone 204 is demonstrated in FIG. 2B.

Phase jitter is a time variation in the clock edge produced by VCO 106, in which the edge moves back and forth instantaneously and oscillates around the targeted position. This is undesirable because it results in a dynamically varying amount of time available for logic computations. Phase jitter translates to phase noise in the frequency domain, and can prevent PLL 100 from locking on the correct data frequency. This is a serious problem because it prevent the receiving unit from correctly reading the transmitted data.

SUMMARY OF THE INVENTION

The present invention provides an improved error and reference signal generation method in the phase detection circuitry. This improvement permits high frequency signal phase alignment when incorporated into a phase-locked loop. The improvement also facilitates the balancing of flip-flop size, strength, and density, while maintaining a low propensity for phase jitter at higher frequencies. The improved phase detector system may be broadly conceptualized as a system that uses multiple sections and cascades them in order to prevent timing errors such as missed pulses. This allows the system to operate at higher frequencies without the addition of large amounts of complex circuitry and without the need for highly tuned fabrication processes.

A phase locked loop that implements an improved phase detector circuit in accordance with the present invention comprises a first section configured to generate a first output signal from an input signal on a first clock edge. The first section also generates a second output signal from the input signal on a second clock edge.

The first section is coupled to a second section configured to generate a third output signal from the first output signal on the first clock edge. The second section also generates a fourth output signal from the second output signal on the second clock edge. By generating the third and fourth output signals on the same clock edge as used in the first section, as opposed to the opposite clock edge, the circuit effectively doubles the time available for correct signal interpretation. This allows for operation at higher frequencies.

The input signal and the first output signal can also be coupled to a third section, which is configured to compare the two signals and to generate a first phase detection signal based on the comparison. The first phase detection signal comprises a pulse for every input signal pulse. The width of the first phase detection signal pulse is dependent on the phase difference between the clock signal and the input signal.

The outputs of the first section and the second section can be coupled to a fourth section, configured to compare the two signals and to generate a second phase detection signal based on the comparison. The second phase detection signal comprises a pulse for every input signal pulse. The width of the second phase detection signal pulse is independent of the phase difference between the clock signal and the input signal, and is used as a reference signal.

Comparison of the average values of the two phase detection signals provides a method for detecting phase offset between the input signal and the clock signal. This information can be fed to a clock generator that can increase or decrease its frequency to bring the input signal and clock signal into phase.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The present invention will be described with reference to the accompanying drawings, wherein.

The components in the figures are not necessarily to scale, emphasis instead being placed upon illustrating the principles of the invention. In the figures, like reference numerals designate corresponding parts throughout the different views.

DETAILED DESCRIPTION OF THE INVENTION

The problems described above, in relation to conventional phase detection circuits, are solved by the current invention. The invention accomplishes this by passing the incoming data through cascaded flip-flops operated off of the same clock edge instead of opposite clock edges. This doubles the amount of time available for the second flip-flop to recognize retimed data coming from the first. The second flip-flop will not read the data coming from the first flip-flop until an entire clock period has past, as opposed to conventional circuitry which would read the data at the next immediate clock edge, or only one-half clock period later. This allows the circuit to function with setup and hold times that would cause conventional circuitry to miss pulses, and allows for operation at higher frequencies.

The addition of a second stage of cascaded flip-flops also provides more freedom to adjust circuit geometry. This is because the outputs of the first stage of flip-flops do not have to drive the additional load created by the reference XOR gate as it would in a conventional circuit. As a result, the first stage of flip-flops can be smaller and therefore more receptive to high speed incoming data, while the second stage can be larger and more capable of driving the output loads. Accordingly, the circuit can meet the needs of a host of different individual applications.

Figure 4:
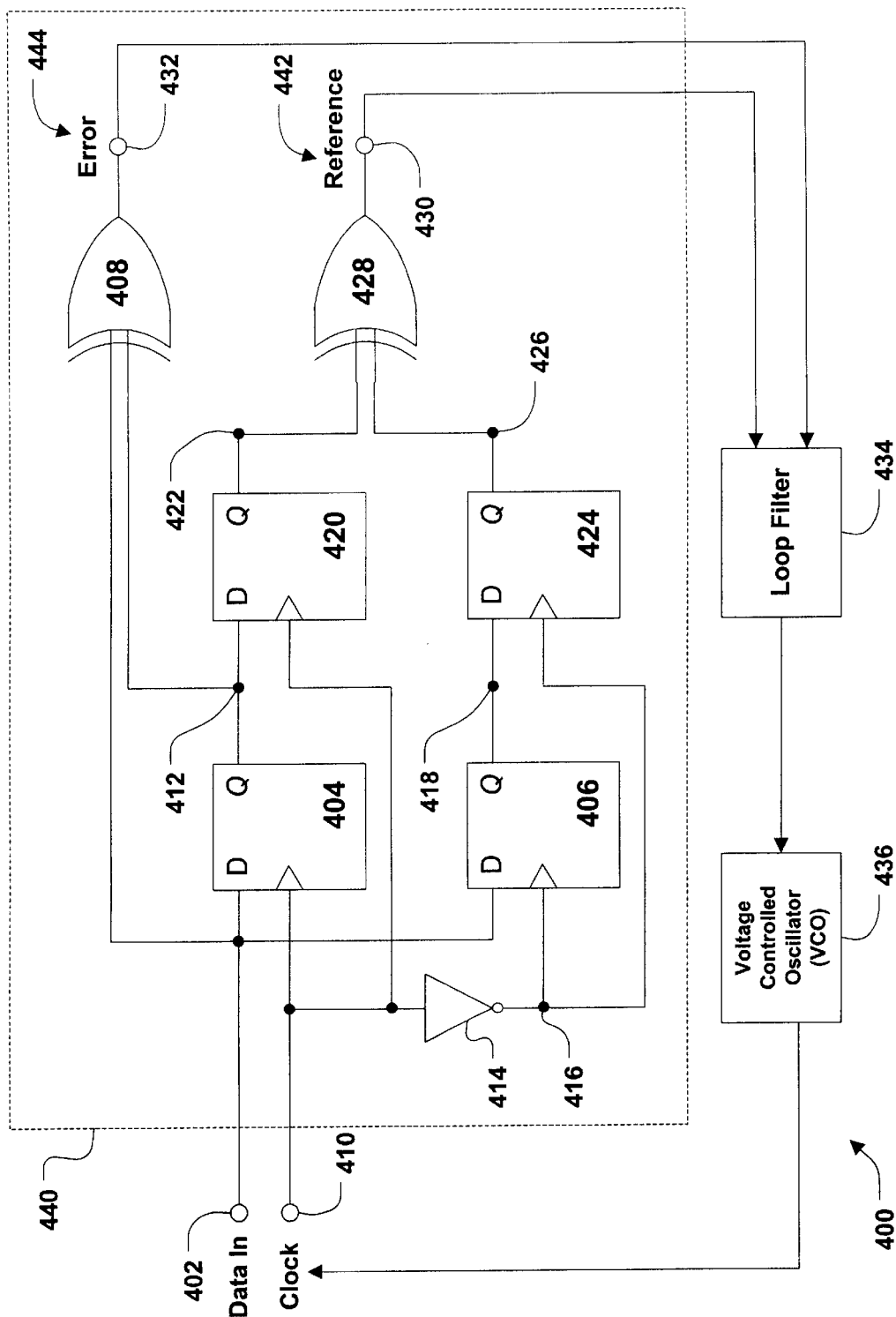
FIG. 4 is a schematic diagram of a preferred embodiment of the present invention as implemented in a phase-locked loop clock recovery system.

FIG. 4 depicts an example phase-locked loop circuit 400 in accordance with one embodiment of the invention. Circuit 400 comprises VCO 436, loop filter 434 and phase detector 440, shown encompassed by a dashed line. Incoming data is routed to phase detector 440 through node 402. Node 402 is connected to the inputs of D flip-flop 404, D flip-flop 406, and XOR gate 408. D flip-flop 404 has one clock input supplied at node 410, and one output at node 412. D flip-flop 406 has one clock input supplied by inverter 414 at node 416, and one output at node 418. D flip-flop 404 is triggered off of a positive or rising clock edge. D flip-flop 406 is triggered off of the opposite clock edge. This opposite edge is equivalent to the negative or falling clock edge in relation to D flip-flop 404.

The output of D flip-flop 404 is tied directly to the input of D flip-flop 420, as well as the second input of XOR gate 408 at node 412. D flip-flop 420 has one clock input at node 410, and one output at node 422. D flip-flop 420 is triggered off of the same clock edge as D flip-flop 404.

The output of D flip-flop 406 is tied directly to the input of D flip-flop 424 at node 418. D flip-flop 424 has one clock input at node 416, and one output at node 426. D flip-flop 424 is triggered off of the same clock edge as D flip-flop 406, which is the opposite edge in relation to D flip-flops 404 and 420.

Figure 1:
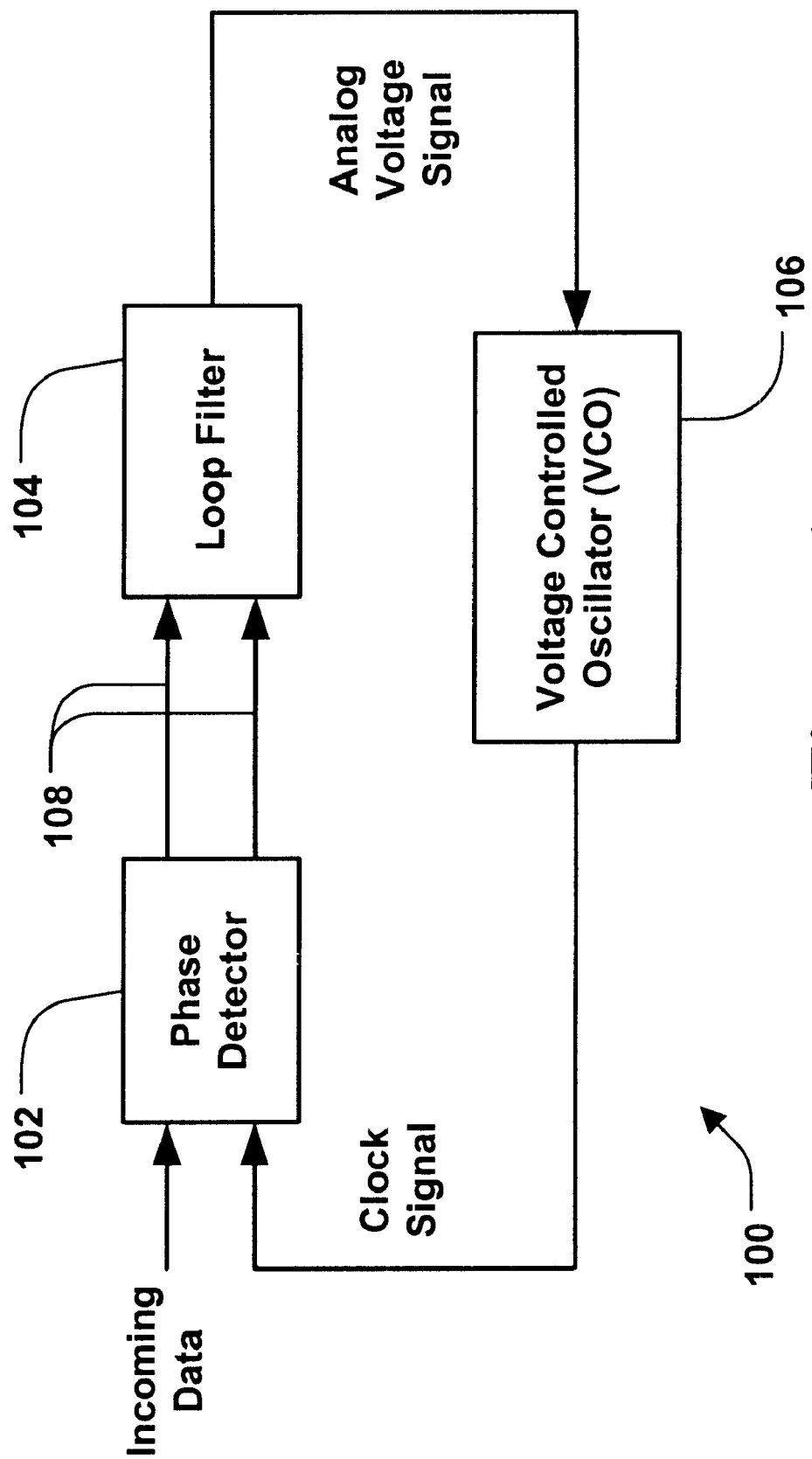
FIG. 1 is block diagram of the typical elements of a phase-locked loop clock recovery system.
Figure 2A:
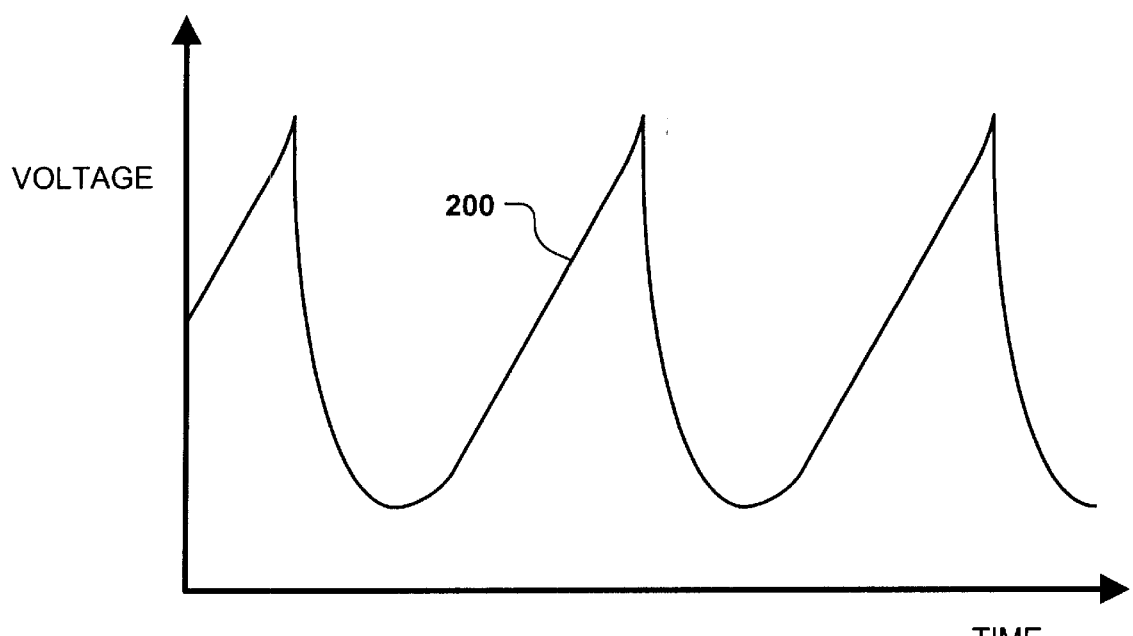
FIG. 2A is a typical filtered analog voltage signal as a function of time that is input to a voltage controlled oscillator circuit.
Figure 2B:
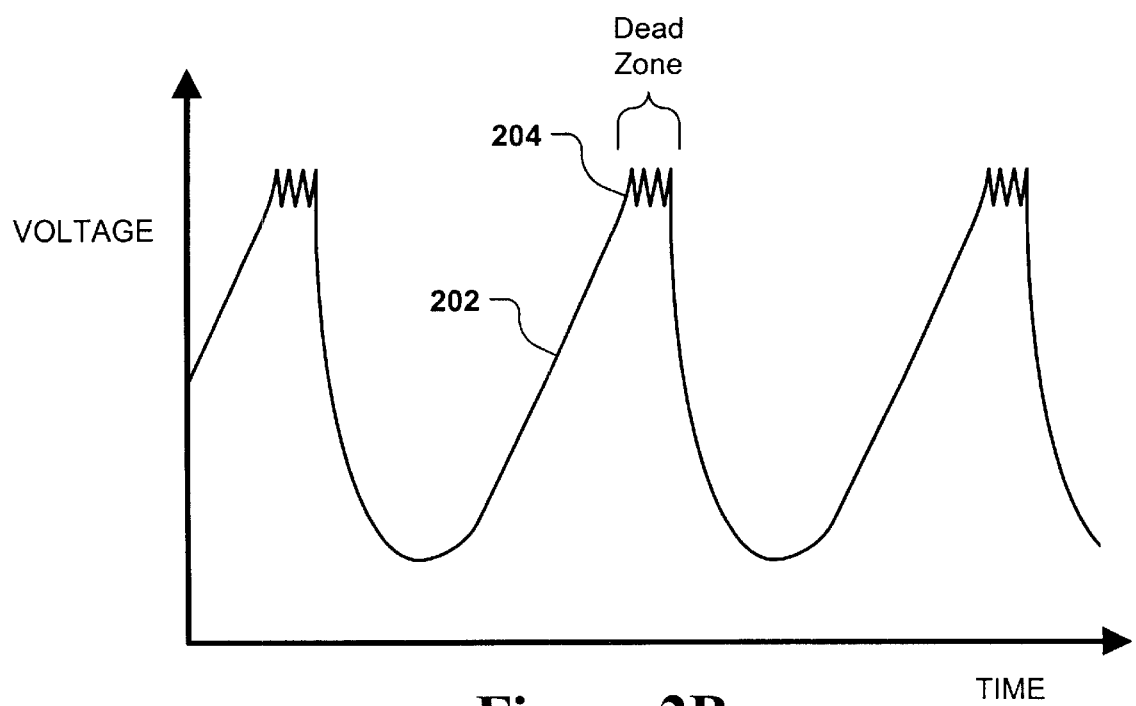
FIG. 2B is a typical filtered analog voltage signal as a function of time where the phase-locked loop is operating at higher frequencies resulting in phase jitter.
Figure 3:
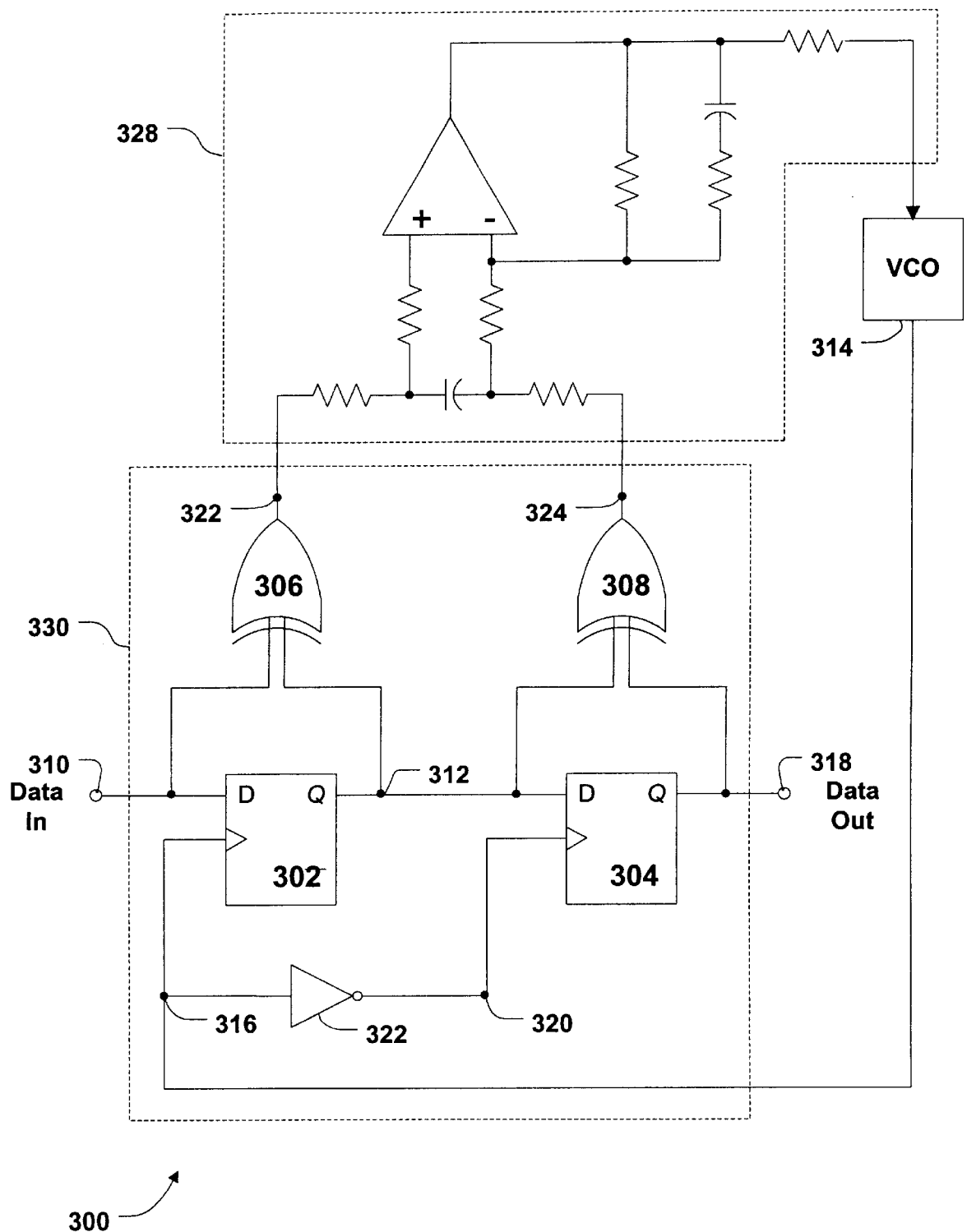
FIG. 3 is a conventional phase detector circuit used in the phase detector capacity as depicted in FIG. 1.

The outputs of D flip-flop 420 at node 422 and D flip-flop 424 at node 426 are tied to the inputs of XOR gate 428. The output of this gate at node 430 is commonly referred to as the REFERENCE 442 signal. The REFERENCE 442 signal will be a logic high whenever the inputs to XOR gate 428 are complementary, or opposite logic levels. The output of XOR gate 408 at node 432 is commonly referred to as the ERROR 444 signal and it functions in the same manner as XOR gate 428, producing a logic high signal whenever the inputs are complementary. These two signals are the phase detection signals for the PLL 400 and would be connected directly to a loop filter 434 in the same manner as depicted in FIG. 2. The net difference between these two signals is reflective of the phase offset between the incoming data and the clock provided by VCO 436.

Figure 5:
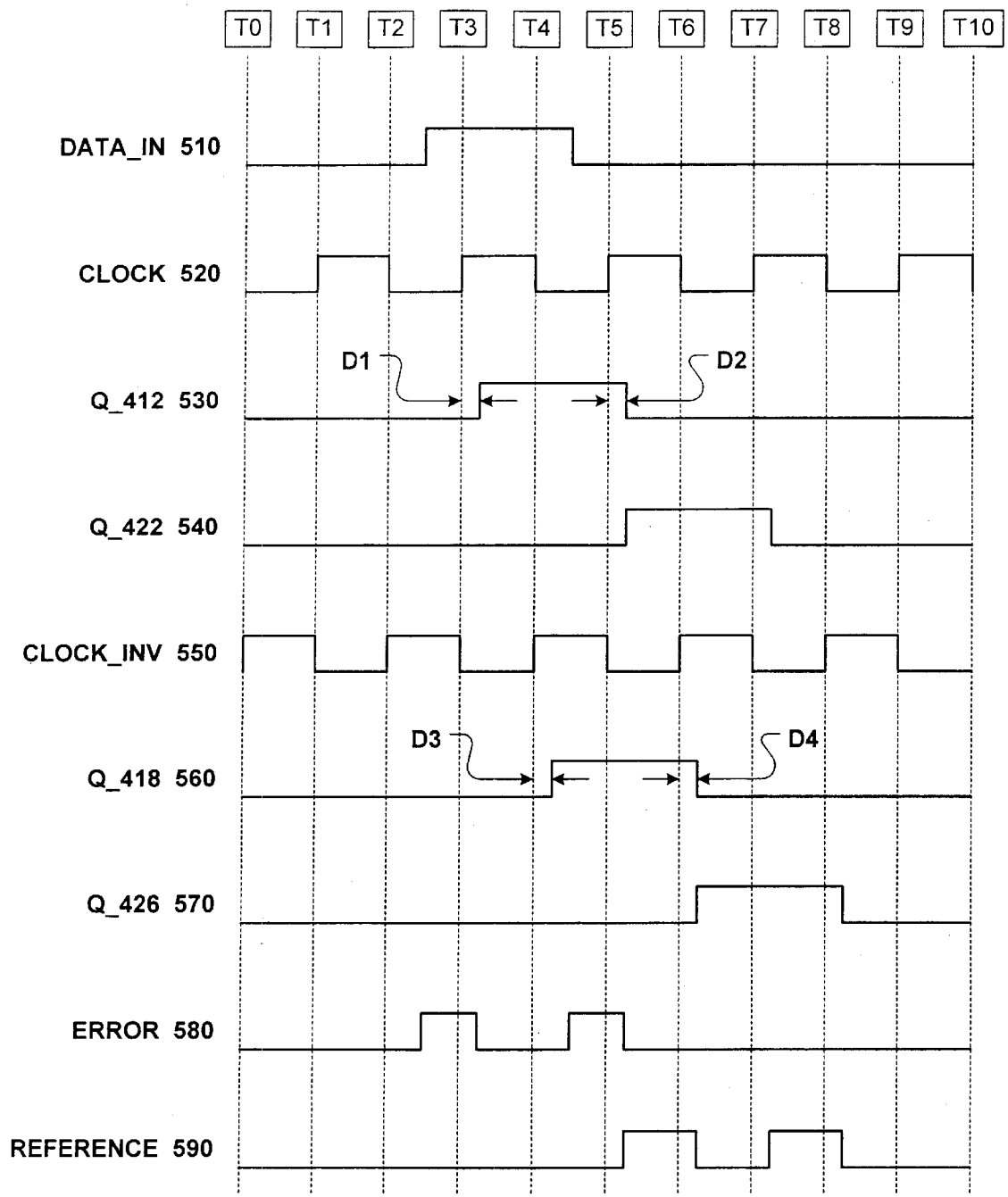
FIG. 5 is a timing diagram depicting waveforms present at various nodes in response to an arbitrary input data sequence to the system of FIG. 4.

FIG. 5 is a timing diagram showing the operation of the phase detection circuit 440 in FIG. 4. The diagram displays the typical timing of this circuit at an instance when an incoming data signal is out of phase with the clock. This diagram only shows the various responses of the elements in phase detector 440 as supplied by a clock from VCO 436, it does not show any clock frequency modulations that would result when this circuit is coupled with a charge pump and a loop filter.

DATA_IN signal 510 is the signal present at node 402 of FIG. 4, where the received data is input into phase detection circuitry 440, i.e. D flip-flops 404 and 406, as well as the first input of XOR gate 408. CLOCK signal 520 is the clock signal supplied to phase detection circuitry 440 at node 410. Q_412 signal 530 is the signal output from D flip-flop 404 at node 412 and supplied to the input of D flip-flop 420 and the second input of XOR gate 408. Q_422 signal 540 is the signal output from D flip-flop 420 at node 422 and supplied to the first input of XOR gate 428. CLOCK_INV signal 550 is the inverted clock signal supplied to D flip-flop 406 at node 416. Q_418 signal 560 is the signal output from D flip-flop 406 at node 418 and supplied to the input of D flip-flop 424. Q_426 signal 570 is the signal output from D flip-flop 424 at node 426 and supplied to the second input of XOR gate 428. ERROR signal 580 is the output signal of XOR gate 408 present at node 432. REFERENCE signal 590 is the signal output from XOR gate 428 at node 430.

The timing diagram displays the voltage levels present at time T0 after DATA_IN signal 510 has been low for an extended period of time. All non-clock signals will remain low during that time. DATA_IN signal 510 is a received data signal originating from a transmitting source and is relationally independent from the other signals in the diagram. DATA_IN signal 510 shown in FIG. 5 is typical of what a received data signal might look like. DATA_IN signal 510 first transitions from a low to a high between time T2 and time T3. At time T3, CLOCK signal 520 transitions from low to high and enables D flip-flop 404 to capture the high level present at it's input 402. This high level is passed to the D flip-flop 404 output 412 and creates the low to high transition of Q_412 530 which occurs after a delay D1 from time T3. Delay D1 is the time it takes for the internal D flip-flop 404 circuitry to recognize and pass the input data to it's output. In addition, D1 includes the rise time associated with this output due to the parasitic loads created by the surrounding circuitry. As a result of delay D1, the input to D flip-flop 420 has a logic low level present when CLOCK 520 transitions at time T3. Accordingly, D flip-flop 420 output signal Q_422 540 remains at a logic low level.

DATA_IN 510 transitions from high to low shortly after time T4. The next rising edge on CLOCK 520 occurs at time T5, at which point D flip-flop 404 is enabled to capture the logic low level DATA_IN 510 signal present at it's input 402. This low level signal is passed to the D flip-flop 404 output 412 and creates the high to low transition of Q_412 530 after a delay D2 from time T5.

As a result of delay D2, the input to D flip-flop 420 has a logic high signal present when CLOCK 520 transitions at time T5, which results in the low to high transition of Q_422 540. This is what allows the improved circuit 440 to operate at higher frequencies with little phase jitter. By clocking D flip-flop 420 on the rising clock edge at time T5, as opposed to the preceding falling clock edge at time T4, the circuit minimizes the chance that delay D1 could be so large as to cause D flip-flop 420 to miss the DATA_IN pulse. If D flip-flop 420 was clocked at the prior clock edge at time T4, and if delay D1 extended past time T4, D flip-flop 420 would miss the DATA_IN pulse, resulting in a dead zone in the analog voltage signal, which would then translate to undesired phase jitter.

Upon the next rising edge of CLOCK 520 at time T7, DATA_IN 510 is low and therefore Q_412 530 remains at a logic low level. D flip-flop 420 is enabled with this low logic level present at it's input 412 at time T7, which results in the high to low transition of Q_422 540. Because DATA_IN 510 remains low through time T10, signals Q_412 530 and Q_422 540 remain low as well.

After DATA_IN 510 first transitions from low to high, the next rising edge on CLOCK_INV 550 occurs at time T4. This enables D flip-flop 406 to capture the high level present at it's input 402. This high level is passed to the D flip-flop 406 output 418 and creates the low to high transition of Q_418 560. Note that Q_418 560 does not transition precisely at time T3, but does so after a delay D3. Again, this is accounted for by the time it takes for the internal D flip-flop 406 circuitry to recognize and pass the input data to it's output. In addition, D3 includes the rise time associated with this output due to the parasitic loads created by the surrounding circuitry. As a result of delay D3, the input to D flip-flop 424 has a logic low level present when CLOCK__INV 550 transitions at time T4, which results in the corresponding low signal Q__426 570 present at the output 426.

DATA__IN 510 transitions from high to low shortly after time T4. The next rising edge on CLOCK__INV 550 occurs at time T6, at which point D flip-flop 406 is enabled to capture the logic low level DATA__IN 510 signal present at it's input 402. This low level is passed to the D flip-flop 406 output 418 and creates the high to low transition of Q__418 560. Again, this does not happen precisely at time T6, but after a delay D4.

As a result of delay D4, the input to D flip-flop 424 has a logic level high signal present when CLOCK__INV 550 transitions, which results in the low to high transition of Q__426 570. Again this demonstrates how the improved circuit 440 can operate at higher frequencies with little phase jitter. By clocking D flip-flop 424 on the rising clock edge at time T6, as opposed to the preceding falling clock edge at time T5, the circuit minimizes the chance that delay D3 could be so large as to cause D flip-flop 424 to miss the DATA__IN pulse. If D flip-flop 424 was clocked at the prior clock edge at time T5, and if delay D3 extended past time T5, D flip-flop 424 would miss the DATA__IN pulse, resulting in a dead zone in the analog voltage signal, which would then translate to undesired phase jitter.

Upon the next rising edge of CLOCK__INV 550 at time T8, DATA__IN 510 is low and therefore Q__418 560 remains at a logic low level. D flip-flop 424 is enabled when CLOCK__INV 550 transitions at time T8 with this low logic level present at it's input 418, which results in the high to low transition of Q__426 570.

XOR gate 408 presents a low level at its output 432 whenever both of its inputs are at the same logic level. From time T0 until shortly after time T2 where DATA__IN 510 transitions from low to high, the inputs DATA__IN 510 and Q__412 530 to XOR gate 408 are low. Therefore the output signal ERROR 580 to XOR gate 408 is low. During the time period between the transition from low to high of DATA__IN 560 and when it transitions to low again, DATA__IN 510 is high and Q__412 530 is low. Because the logic levels are different, ERROR 580 transitions from low to high. It remains high until Q__412 530 becomes high just after T3, at which time ERROR 580 transitions back to low. ERROR 580 transitions to high again in response to DATA__IN 510 transitioning to low after T4. Finally, ERROR 580 transitions back to low when Q__412 530 transitions to low after time T5.

XOR gate 428 presents a logic low level signal REFERENCE 590 at its output 430 whenever both of its inputs are at the same logic level. From time T0 until shortly after time T5 where Q__422 540 transitions from low to high, the inputs Q__422 540 and Q__426 570 to XOR gate 428 are low. Therefore the output signal REFERENCE 590 to XOR gate 428 is low. During the time period between when Q__422 540 transitions from low to high and when it transitions back to low, Q__422 540 is high and Q__426 570 is low. Because the logic levels are different, REFERENCE 590 transitions from low to high. It remains high until Q__426 570 becomes high at which time REFERENCE 590 transitions back to low. REFERENCE 590 again transitions to high in response to Q__422 540 transitioning to low. Then REFERENCE 590 transitions back to low when Q__426 570 transitions to low after time T8.

The ERROR 580 signal and the REFERENCE 590 signal produced between time T2 and time T9 each have an average value. If the ERROR 580 signal had an average value equal to the average value of the REFERENCE 590 signal, the ERROR 580 signal would be in a state corresponding to no phase difference between the DATA__IN 510 signal and the CLOCK 520 signal. In the example illustrated in FIG. 5, the average value of the ERROR 580 signal is different from the average value of the REFERENCE 590 signal. This is illustrated by the different pulse widths in the two signals. The ERROR 580 signal is in a state corresponding to the DATA__IN 510 signal being out of phase with the CLOCK 520 signal. The difference between the average values of the two signals is representative of the phase difference between DATA__IN 510 and CLOCK 520 produced by VCO 314.

ERROR 580 and REFERENCE 590 signals are fed into a loop filter circuit 434. Loop filter circuitry 434 then performs two functions. The first is to determine the difference in the average values of the ERROR 580 signal and the REFERENCE 590 signal. The second function is to produce an analog voltage corresponding to that difference in value between the two phase detection signals. The analog voltage is then filtered to remove extraneous or unwanted noise by loop filter circuitry 434. This analog voltage is then supplied to VCO 436.

VCO 436 can be a conventional voltage-controlled oscillator that produces a clock signal at its output. The clock signal is a series of square pulses that operates at a frequency which is dependent on the voltage level supplied to the control voltage input terminal. The filtered voltage is supplied to the control voltage input terminal of VCO 436 and modulates the oscillator frequency up or down accordingly. VCO 436, for example, can increase its frequency when a positive analog voltage signal is supplied and it can decrease its frequency when a negative analog voltage signal is supplied. The relation between frequency modulation and the analog voltage signal polarity can be chosen arbitrarily to suit the individual application. If the frequency of DATA__IN 510 is stable, the CLK 520 signal will be brought closer to synchronization with each successive incoming pulse, until the two signal are in phase.

While various embodiments of the invention have been described, it will be apparent to those of ordinary skill in the art that many more embodiments and implementations are possible that are within the scope of this invention.

What is claimed is:

1. A phase detection circuit comprising:
   a first section configured to generate a first output signal from an input signal on a first clock edge and to generate a second output signal from the input signal on a second clock edge;
   a second section, coupled with the first section, the second section configured to generate a third output signal from the first output signal on the first clock edge and to generate a fourth output signal from the second output signal on the second clock edge;
   a third section, coupled with the first section and the second section, the third section configured to compare the input signal and the first output signal and to generate a first phase detection signal based on the comparison; and
   a fourth section, coupled with the second section, the fourth section configured to compare the third output signal and the fourth output signal and to generate a second phase detection signal based on the comparison.

2. A circuit as claimed in claim 1, wherein the width of the first phase detection signal is dependent on the phase difference between the input signal and a clock signal which provides the first and second clock edges.

3. A circuit as claimed in claim 1, wherein the first phase detection signal has a first state where the first phase detection signal has an average value that is the same as the average value of the second phase detection signal, the first state corresponding to a condition where the input signal is in phase with the clock signal.

4. A circuit as claimed in claim 1, wherein the first phase detection signal has a second state where the first phase detection signal has an average value different than the average value of the second phase detection signal, the second state corresponding to a condition where the input signal is out of phase with the clock signal.

5. A circuit as claimed in claim 1, wherein the width of the second phase detection signal is independent of the phase difference between the clock signal and the input signal.

6. A circuit as claimed in claim 1, wherein the second phase detection signal pulse has a width corresponding to half of a clock period.

7. A circuit as claimed in claim 1, wherein the third section comprises an exclusive OR (XOR) gate.

8. A circuit as claimed in claim 1, wherein the fourth section comprises an exclusive OR (XOR) gate.

9. A circuit as claimed in claim 1, wherein the first section comprises:
 a first D flip-flop configured to generate the first output signal from said input signal on the first clock edge; and
 a second D flip-flop configured to generate the second output signal from the input signal on the second clock edge.

10. A circuit as claimed in claim 1, wherein the second section comprises:
 a first D flip-flop configured to generate the third output signal from the first output signal on the first clock edge; and
 a second D flip-flop configured to generate the fourth output signal from the second output signal on the second clock edge.

11. A circuit as claimed in claim 1, and further comprising a clock generator configured to generate the clock signal.

12. A circuit as claimed in claim 11, wherein the clock generator modulates the clock signal in proportion to a difference between the first phase detection signal and the second phase detection signal.

13. A circuit as claimed in claim 11, wherein the clock generator is a voltage controlled variable frequency oscillator (VCO).

14. A method for recovering a clock signal and regenerating a data signal comprising the steps of
 passing an input signal through a first section configured to generate a first output signal from the input signal on a first clock edge and a second output signal from the input signal on a second clock edge;
 passing the first and second output signals through a second section configured to generate a third output signal from the first output signal on the first clock edge and a fourth output signal from the second output signal on the second clock edge;
 generating a first phase detection signal based on a comparison of the input signal and the first output signal; and
 generating a second phase detection signal based on a comparison of the outputs of the second section.

15. A method as claimed in claim 14, and further comprising a step of modulating the output clock signal of a clock generator in proportion to the difference between the first phase detection signal and the second phase detection signal.

16. A phase detector comprising:
 a first means for generating a first output signal from an input signal on a first clock edge and for generating a second output signal from the input signal on a second clock edge;
 a second means, coupled with the first means, for generating a third output signal from the first output signal on the first clock edge and for generating a fourth output signal from the second output signal on the second clock edge;
 a third means for comparing the input signal and the first output signal and for generating a first phase detection signal based on the comparison; and
 a fourth means, coupled with the second means, for comparing the third output signal and the fourth output signal and for generating a second phase detection signal based on the comparison.

17. A phase detector as claimed in claim 16, and further comprising a clock generating means for generating a clock signal used to provide the first and second clock edges.

18. A phase detector as claimed in claim 17, wherein the clock generating means modulates the clock signal in proportion to the difference between the first phase detection signal and the second phase detection signal.

19. A system comprising a transmitter configured to transmit a signal and a receiver configured to receive the signal, the receiver comprising:
 a phase detection circuit comprising:
  a first section configured to generate a first output signal from an input signal on a first clock edge; and to generate a second output signal from the input signal on a second clock edge;
  a second section, coupled with the first section, the second section configured to generate a third output signal from the first output signal on the first clock edge and to generate a fourth output signal from the second output signal on the second clock edge;
  a third section, coupled with the first section and the second section, the third section configured to compare the input signal and the first output signal and to generate a first phase detection signal based on the comparison; and
  a fourth section, coupled with the second section, the fourth section configured to compare the third output signal and the fourth output signal and to generate a second phase detection signal based on the comparison.

20. A system as claimed in claim 19, wherein the receiver and transmitter communicate over a network.

* * * * *